United States Patent
Nagai (10) Patent No.: US 10,936,512 B2
(45) Date of Patent: Mar. 2, 2021

(54) ACCURATE CAN-BASED DISTRIBUTED CONTROL SYSTEM SIMULATIONS

(71) Applicant: International Business Machines Corporation, Armonk, NY (US)

(72) Inventor: Shingo Nagai, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 16/351,861

(22) Filed: Mar. 13, 2019

(65) Prior Publication Data
US 2020/0293463 A1    Sep. 17, 2020

(51) Int. Cl.
| | |
|---|---|
| G06F 12/00 | (2006.01) |
| G06F 13/16 | (2006.01) |
| B60W 50/02 | (2012.01) |
| H04L 12/40 | (2006.01) |
| G06F 30/20 | (2020.01) |

(52) U.S. Cl.
CPC ..... *G06F 13/1663* (2013.01); *B60W 50/0225* (2013.01); *G06F 30/20* (2020.01); *H04L 12/40* (2013.01); *H04L 2012/40215* (2013.01); *H04L 2012/40273* (2013.01)

(58) Field of Classification Search
CPC .............. G06F 13/1663; G06F 30/20; B60W 50/0225; H04L 12/40; H04L 2012/40215; H04L 2012/40273
See application file for complete search history.

(56) References Cited

U.S. PATENT DOCUMENTS

| | | |
|---|---|---|
| 9,294,412 B2 | 3/2016 | Horvath et al. |
| 2003/0158980 A1* | 8/2003 | Mizuno ................. G06F 3/0613 710/36 |

(Continued)

FOREIGN PATENT DOCUMENTS

CN        106656663 A      5/2017

OTHER PUBLICATIONS

Avatefipour et al.; "Linking Received Packet to the Transmitter Through Physical-Fingerprinting of Controller Area Network"; 2017 IEEE International Workshop on Information Forensics and Security (WIFS); Rennes, France, 2017; 6 pages.

(Continued)

*Primary Examiner* — Daniel D Tsui
(74) *Attorney, Agent, or Firm* — Cantor Colburn LLP; Steven Meyers (57) ABSTRACT

Embodiments of the present invention are directed to a computer-implemented method for simulating a plurality of electronic control units ("ECU"s) in communication over a simulated bus. The method includes simulating an operation of a first ECU and an operation of a second ECU and performing arbitration at a packet-level granularity at a packet transmission start point with respect to a first packet sent to the simulated bus by the first ECU and a second packet sent to the simulated bus by the second ECU. The method identifies an initially winning ECU in the arbitration and a zone from the packet transmission start point to a bit where the initially winning ECU is determined to win based on the arbitration and continues the simulation of the operation of the first ECU and the operation of the second ECU to the end of the zone.

20 Claims, 8 Drawing Sheets

(56) References Cited

U.S. PATENT DOCUMENTS

2008/0276040 A1* 11/2008 Moritoki ............. G06F 11/1441
  711/113
2015/0063120 A1* 3/2015 Horvath ................ H04L 47/283
  370/237
2016/0292091 A1* 10/2016 Musoll ................... G06F 13/161
2018/0167216 A1* 6/2018 Walrant .............. H04L 63/0428
2018/0374168 A1* 12/2018 Kano ............... G06Q 10/06313

OTHER PUBLICATIONS

Mell et al.; "The NIST Definition of Cloud Computing—Recommendations of the National Institute of Standards and Technology"; U.S. Department of Commerce; Sep. 2011; 7 pages.

Yamada et al.; "Implementation of Bit-Level Transmission Simulator for Evaluating Reliable CAN Systems"; <http://www.cit.nihon-u.ac.jp/laboratorydata/kenkyu/kouennkai/reference/No.50/pdf/P-31.pdf>; 2 pages. (No Translation Available).

* cited by examiner

ACCURATE CAN-BASED DISTRIBUTED CONTROL SYSTEM SIMULATIONS

BACKGROUND

The present invention generally relates to control systems and more specifically, to accurate control area network ("CAN") based distributed control system simulations.

A CAN is a kind of multi-master type communication bus protocol that allows any node to send a message if no message is being transmitted at that time on the bus. A CAN is used for communication among various control systems, such as electronic control units ("ECU") in an automotive vehicle. In such a parallel distributed system, it is common to take advantage of a simulator ahead of verification on real in order to make the software development process efficient. ECU simulators include an Instruction Set Simulator ("ISS") and peripheral simulators. The ECU simulators are interconnected through CANs, one CAN for each ECU simulator, and a CAN bus interconnected among CANs. The ECU simulators need to process during simulation time in synchronization with each other, so as not to drop any message transmitted from another CAN. Frequency of synchronization affects the speed, with reduction in synchronization between ECU simulators required in order to increase speed.

SUMMARY

Embodiments of the present invention are directed to a computer-implemented method for simulating a plurality of electronic control units ("ECU"s) in communication over a simulated bus. A non-limiting example of the computer-implemented method includes simulating, by a processor, an operation of a first ECU and an operation of a second ECU and performing arbitration, by the processor, at a packet-level granularity at a packet transmission start point with respect to a first packet sent to the simulated bus by the first ECU and a second packet sent to the simulated bus by the second ECU. The method identifies, by the processor, an initially winning ECU in the arbitration and a zone from the packet transmission start point to a bit where the initially winning ECU is determined to win based on the arbitration and continues, by the processor, the simulation of the operation of the first ECU and the operation of the second ECU to the end of the zone. The method determines, by the processor, a final winning ECU between the first ECU and the second ECU at the end of the zone and placing a final non-winning ECU in a stop state. The method enables, by the processor, the final winning ECU to unlock the final non-winning ECU from the stop state and permitting the first ECU and the second ECU to proceed to a packet reception point, and permits, by the processor, the final non-winning ECU to receive the packet transmitted by the final winning ECU.

Embodiments of the present invention are directed to a system for simulating a plurality of electronic control units ("ECU"s) in communication over a simulated bus. A non-limiting example of the system includes a processor and a memory communicatively coupled to the processor. The memory has stored therein instructions that when executed cause the processor to simulate an operation of a first ECU and an operation of a second ECU and perform arbitration at a packet-level granularity at a packet transmission start point with respect to a first packet sent to a simulated bus by the first ECU and a second packet sent to the simulated bus by the second ECU. The instructions cause the processor to identify an initially winning ECU in the arbitration and a zone from the packet transmission start point to a bit where the initially winning ECU is determined to win based on the arbitration and continue the simulation of the operation of the first ECU and the operation of the second ECU to the end of the zone. The instructions further cause the processor to determine a final winning ECU between the first ECU and the second ECU at the end of the zone and place a final non-winning ECU in a stop state. The instructions cause the processor to enable the final winning ECU to unlock the final non-winning ECU from the stop state and permit the first ECU and the second ECU to proceed to a packet reception point and permit the final non-winning ECU to receive the packet transmitted by the final winning ECU.

Embodiments of the invention are directed to a computer program product for simulating a plurality of electronic control units ("ECU"s) in communication over a simulated bus, the computer program product comprising a computer readable storage medium having program instructions embodied therewith. The program instructions are executable by a processor to cause the processor to perform a method. A non-limiting example of the method includes simulating an operation of a first ECU and an operation of a second ECU and performing arbitration at a packet-level granularity at a packet transmission start point with respect to a first packet sent to the simulated bus by the first ECU and a second packet sent to the simulated bus by the second ECU. The method identifies an initially winning ECU in the arbitration and a zone from the packet transmission start point to a bit where the initially winning ECU is determined to win based on the arbitration and continues the simulation of the operation of the first ECU and the operation of the second ECU to the end of the zone. The method determines a final winning ECU between the first ECU and the second ECU at the end of the zone and placing a final non-winning ECU in a stop state. The method enables the final winning ECU to unlock the final non-winning ECU from the stop state and permitting the first ECU and the second ECU to proceed to a packet reception point, and permits the final non-winning ECU to receive the packet transmitted by the final winning ECU.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 1:
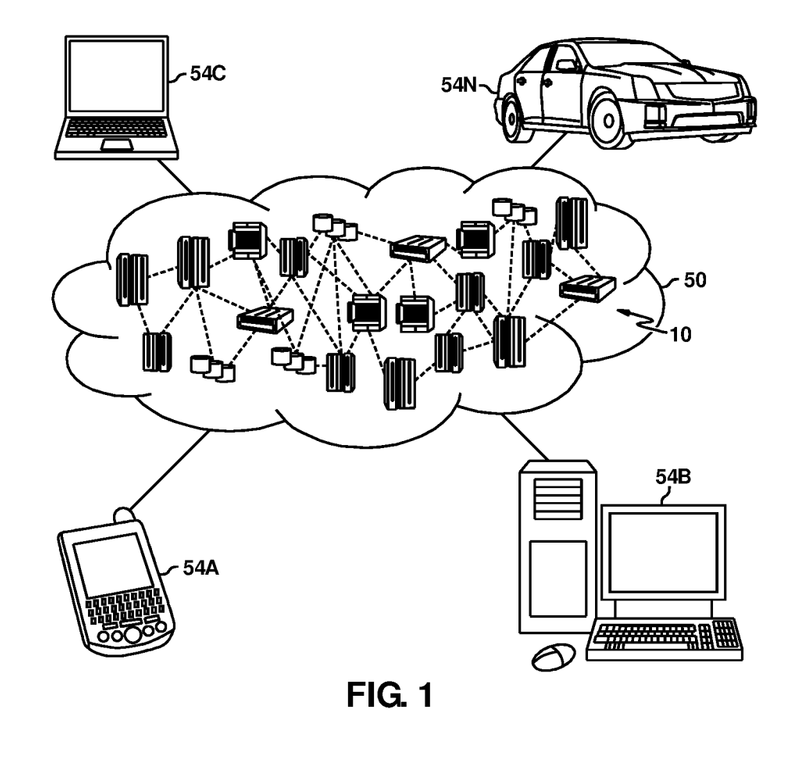
FIG. 1 depicts a cloud computing environment according to an embodiment of the present invention.

Referring now to FIG. 1, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
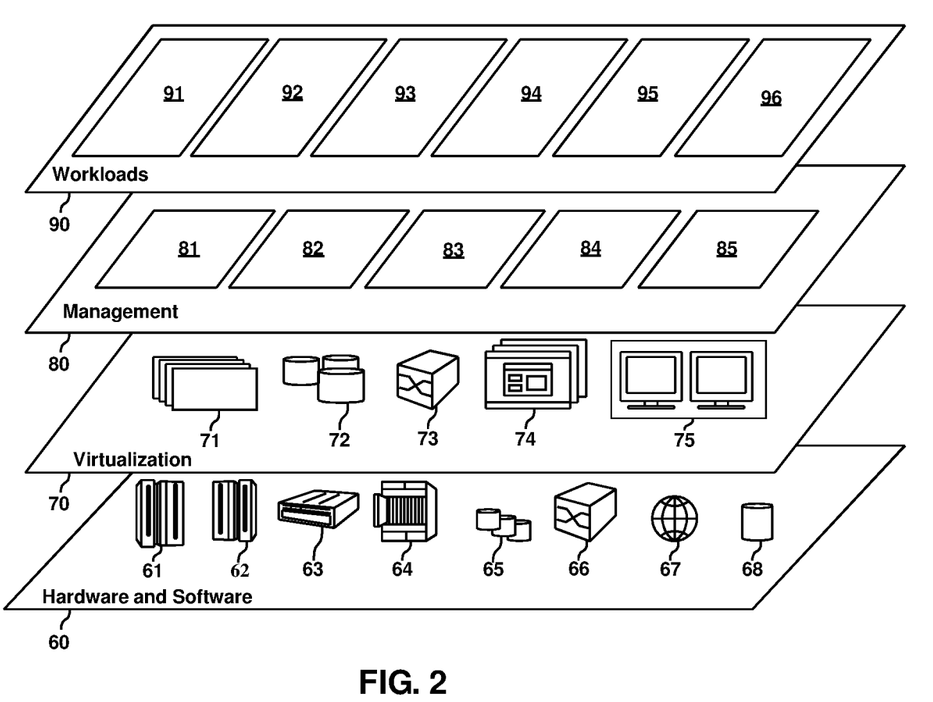
FIG. 2 depicts abstraction model layers according to an embodiment of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; CAN processing 95; and ECU processing 96.

Figure 3:
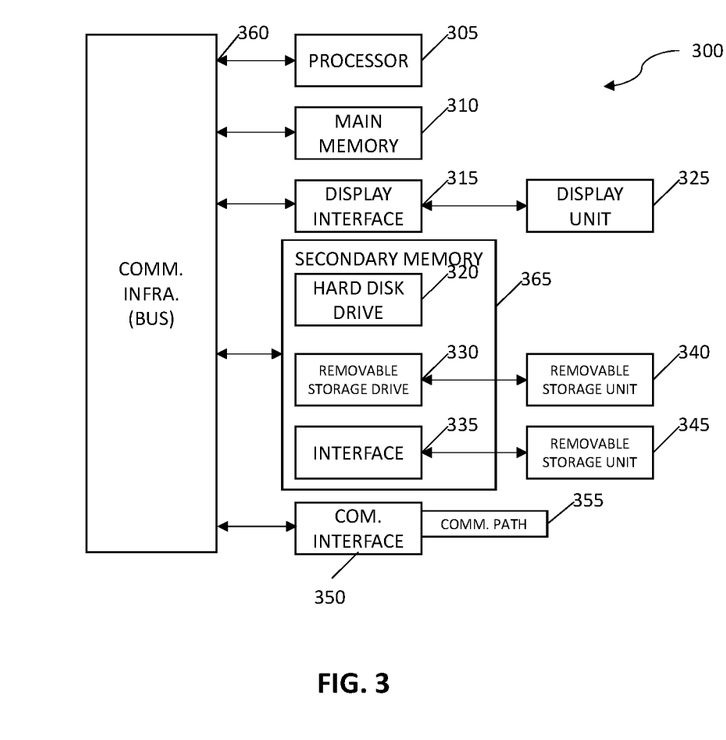
FIG. 3 depicts a high-level block diagram computer system, which can be used to implement one or more aspects of the present invention.

FIG. 3 depicts a high-level block diagram computer system 300, which can be used to implement one or more aspects of the present invention. More specifically, computer system 300 can be used to implement some hardware components of embodiments of the present invention. Although one exemplary computer system 300 is shown, computer system 300 includes a communication path 355, which connects computer system 300 to additional systems (not depicted) and can include one or more wide area networks (WANs) and/or local area networks (LANs) such as the Internet, intranet(s), and/or wireless communication network(s). Computer system 300 and additional system are in communication via communication path 355, e.g., to communicate data between them.

Computer system 300 includes one or more processors, such as processor 305. Processor 305 is connected to a communication infrastructure 360 (e.g., a communications bus, cross-over bar, or network). Computer system 300 can include a display interface 315 that forwards graphics, text, and other data from communication infrastructure 360 (or from a frame buffer not shown) for display on a display unit 325. Computer system 300 also includes a main memory 310, preferably random access memory (RAM), and can also include a secondary memory 365. Secondary memory 365 can include, for example, a hard disk drive 320 and/or a removable storage drive 330, representing, for example, a floppy disk drive, a magnetic tape drive, or an optical disk drive. Removable storage drive 330 reads from and/or writes to a removable storage unit 340 in a manner well known to those having ordinary skill in the art. Removable storage unit 340 represents, for example, a floppy disk, a compact disc, a magnetic tape, or an optical disk, etc. which is read by and written to by removable storage drive 330. As will be appreciated, removable storage unit 340 includes a computer readable medium having stored therein computer software and/or data.

In alternative embodiments, secondary memory 365 can include other similar means for allowing computer programs or other instructions to be loaded into the computer system. Such means can include, for example, a removable storage unit 345 and an interface 335. Examples of such means can include a program package and package interface (such as that found in video game devices), a removable memory chip (such as an EPROM, or PROM) and associated socket, and other removable storage units 345 and interfaces 335 which allow software and data to be transferred from the removable storage unit 345 to computer system 300.

Computer system 300 can also include a communications interface 350. Communications interface 350 allows software and data to be transferred between the computer system and external devices. Examples of communications interface 350 can include a modem, a network interface (such as an Ethernet card), a communications port, or a PCM-CIA slot and card, etcetera. Software and data transferred via communications interface 350 are in the form of signals which can be, for example, electronic, electromagnetic, optical, or other signals capable of being received by communications interface 350. These signals are provided to communications interface 350 via communication path (i.e., channel) 355. Communication path 355 carries signals and can be implemented using wire or cable, fiber optics, a phone line, a cellular phone link, an RF link, and/or other communications channels.

In the present description, the terms "computer program medium," "computer usable medium," and "computer readable medium" are used to generally refer to media such as main memory 310 and secondary memory 365, removable storage drive 330, and a hard disk installed in hard disk drive 320. Computer programs (also called computer control logic) are stored in main memory 310 and/or secondary memory 365. Computer programs can also be received via communications interface 350. Such computer programs, when run, enable the computer system to perform the features of the present invention as discussed herein. In particular, the computer programs, when run, enable processor 305 to perform the features of the computer system. Accordingly, such computer programs represent controllers of the computer system.

Turning now to an overview of technologies that are more specifically relevant to aspects of the invention, in a CAN a message sender is determined by bit-wise arbitration on the CAN bus in CAN communication. A simulator, which simulates actual hardware behavior, monitors the bus and compares its own sending bit to bus level every bit. Although this bit-wise simulation is accurate, synchronization between control system simulators is required every bit, so the drawback is slow simulation speed.

In order to make simulation speed faster, there is an implementation of packet-wise type simulation, where each control system simulator sends CAN messages as packet level, and CAN bus simulator have a packet-wise arbitration function. This packet-wise simulation is much faster than bit-wise simulation due to the reduction of the number of synchronization, but it does not simulate actual hardware behavior. Therefore, there is a case of arbitration result contradiction when reset instructions are issued ahead of arbitration completion. Therefore, traditional simulation methods have an incompatibility between accuracy and speed. In other words, traditional simulation methods must choose between either accuracy or speed.

Turning now to an overview of the aspects of the invention, one or more embodiments of the invention address the above-described shortcomings of the prior art by providing a method that improves the accuracy of packet-wise simulation to the same accuracy level of bit-wise simulation. In packet-wise simulation, since each ECU simulator does not know when a CAN packet arrives beforehand, it simulates within a base synchronization interval ("BSI"), which is defined based on minimum CAN packet length, to always receive any packet from other simulators.

During simulation, when an ECU simulator executes a packet transmit instruction, it stops the simulation at that time and the other ECU simulators stop at the end of BSI. Then, a CAN bus simulator proceeds to the time when the packet transmission is executed and performs arbitration by comparing conflicted packets' content. CAN bus simulator know how many bits are required to decide a winner between conflicted senders at this time by comparing arbitration fields of all the conflicted packets.

"Winner Undetermined Zone" ("WUZ") is defined as the duration from a start of sending a packet until a winner is decided. The winner can be changed if an original winner issues a reset instruction. Thus, the CAN bus simulator permits all the senders to proceed to the end of the WUZ. It determines a winner among senders who reach the end of the zone, and this process can occur multiple times. Thus, there are some ECU simulators in the simulation environment where a conflict between multiple packets (more than 2 packets) could occur. In some case, winner and WUZ could be updated multiple times as shown in 760 in FIG. 7. The ECU simulator that issues a reset instruction during the WUZ becomes a loser even if it could have been a winner without the reset instruction, which is the same behavior as real hardware. Once a winner is determined, all the ECU simulators and CAN bus simulator proceed to the time of packet arrival from the winner, receive the packet, then perform synchronization. By this sequence of synchronization, consistent simulation result can be obtained, which is the same as the one on real hardware in spite of packet-wise based simulation.

The above-described aspects of the invention address the shortcomings of the prior art by providing a simulation environment that is both fast and accurate. It provides packet-wise simulation speed with bit-wise simulation accuracy.

Figure 4:
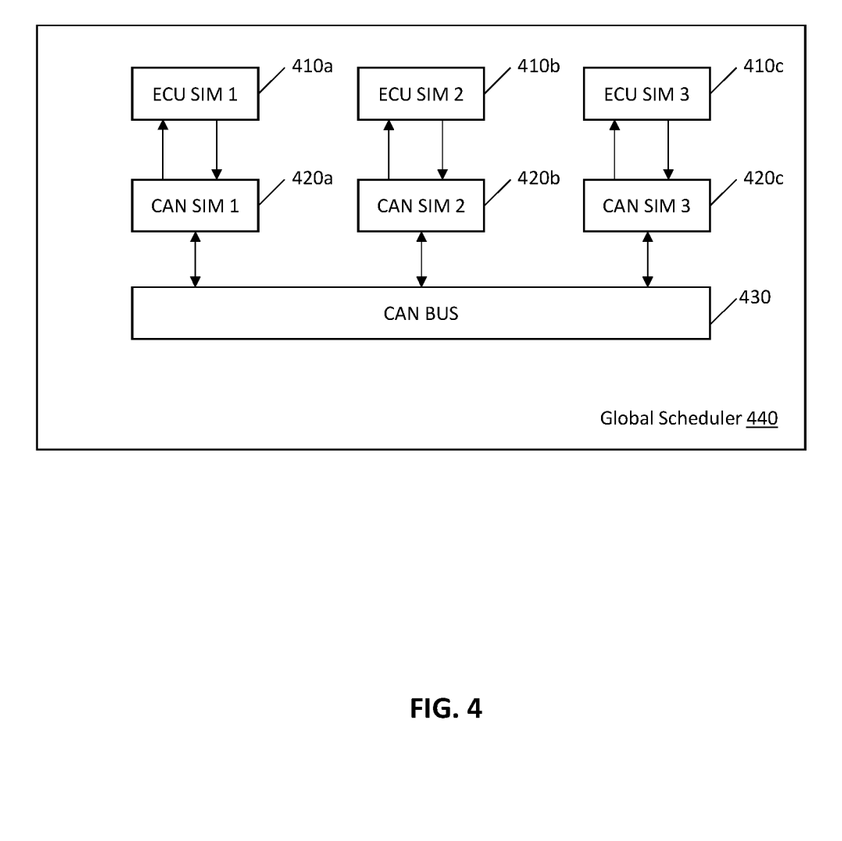
FIG. 4 depicts a simulation environment in accordance with an embodiment of the present invention.
Figure 5:
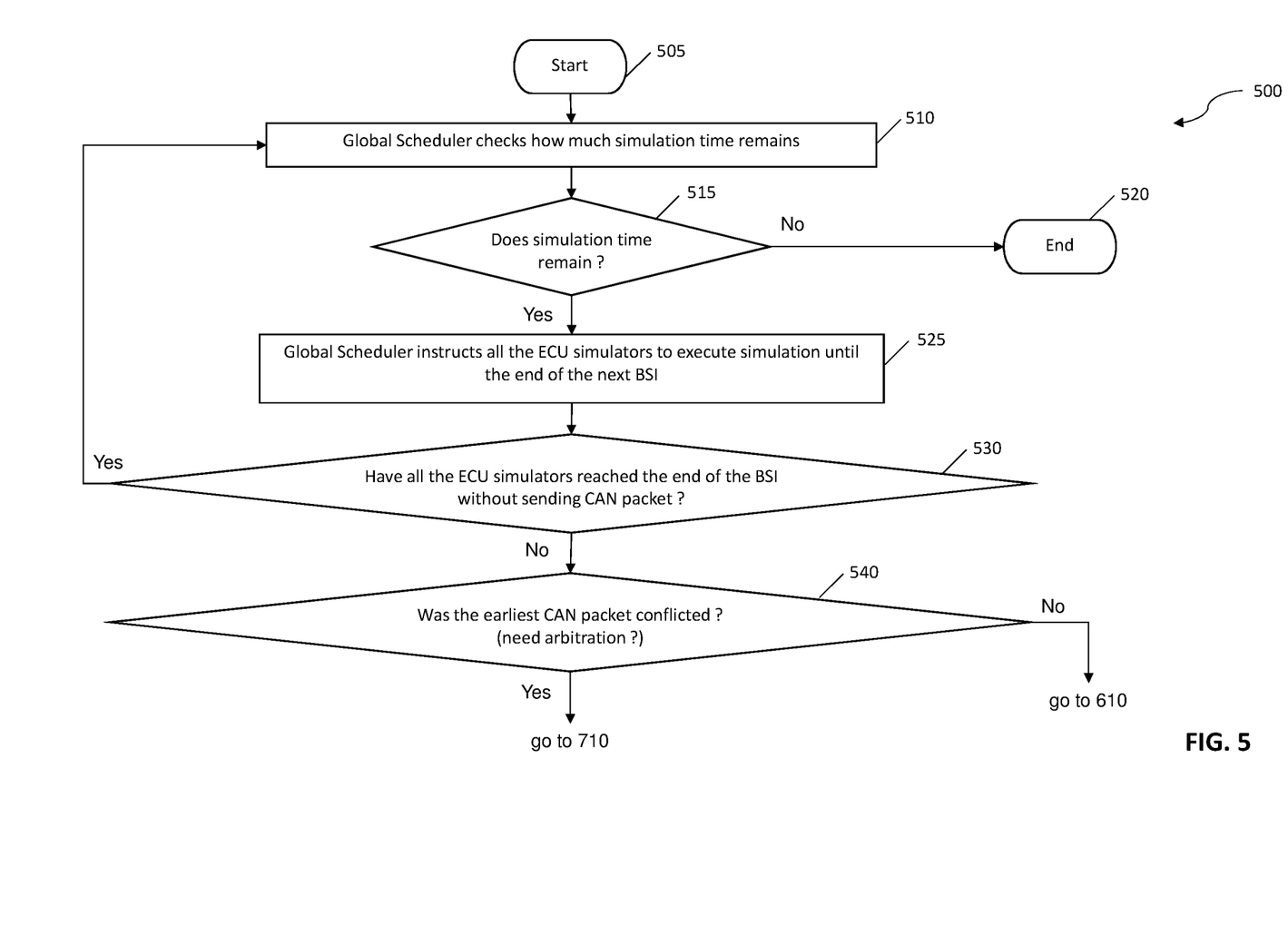
FIGS. 5-8 depict a flowchart of a CAN-based distributed control system simulation in accordance with an embodiment of the present invention.

Turning now to a more detailed description of aspects of the present invention, FIG. 4 depicts a simulation environment in accordance with an embodiment of the present invention. A plurality of simulators are illustrated in the figure. Three ECU simulators 410, ECU SIM 1 410a, ECU SIM 2 410b, and ECU SIM 3 410c, simulate the operation of individual electronic control units. A hardware electronic control unit comprises a processor, memory, and peripherals, but the ECU simulators 410 reside in software running on processor 305 and stored in main memory 310 or secondary memory 365. In an alternative embodiment, the ECU simulators 410 may reside in the cloud and run on hardware and software layer 60. So while the remainder of this description will be with respect to running on processor 305 and being stored in main memory 310 or secondary memory 365, those of ordinary skill in the art after reading this specification will understand that each of the simulations and methods described may also reside in the cloud as described with respect to FIGS. 1 and 2.

A plurality of CAN simulators 420, CAN SIM 1 420a, CAN SIM 2 420b, and CAN SIM 3 420c, are in communication with respective ECU simulators 410. The CAN simulators run on processor 305 and are stored in main memory 310 or secondary memory 365. Each of the CAN simulators 420 are in communication with each other through a CAN BUS 430 that is also simulated and running on processor 305, being stored in main memory 310 or secondary memory 365. A Global Scheduler 440, running on processor 305 and stored in main memory 310 or secondary memory 365, coordinates the interaction and functionality among the ECU simulators 410 and the CAN simulators 420.

The data frame format for a CAN transmission is well known and comprises the following bits, in order (with the number of bits indicated in parentheses after each entry: SOF (1); ID (11); RTR (1); Control Field (6); Data Field (0-64); CRC sequence (15); CRD delimiter (1); ACK slot (1); EOF (7); and ITM (3). The ID field is used as the arbitration field. In case of a packet conflict, it is used to decide the winner. Low level prevails over high level, where low level is the dominant level and high level is the recessive level.

Each ECU simulator 410 can send messages at any time through CAN simulators 420 to each other. When a CAN BUS 430 busy is detected, another CAN simulator 420 is sending a message on the CAN BUS 430. Arbitration is executed by CAN bus simulator 430, and each CAN simulator 420 synchronizes with each other CAN simulator 420 to send and receive packets.

FIGS. 5-8 depict a flowchart of a CAN-based distributed control system simulation 500 in accordance with an embodiment of the present invention. Starting on FIG. 5, the simulation begins at stage 505. The Global Scheduler 440 checks to see how much simulation time remains in the simulation (Stage 510). If no simulation time remains (Stage 515), then the simulation ends (Stage 520). If simulation time remains (Stage 515), the Global Scheduler 440 instructs all the ECU simulators 410 to execute the simulation until the end of the next BSI (previously defined) (Stage 525). If all of the ECU simulators 410 have reached the end of the BSI without sending CAN packets (Stage 530), then flow returns to Stage 510. If not all of the ECU simulators 410 have reached the end of the BSI without sending CAN packets (Stage 530), then a check is made to see if an earliest CAN packet is conflicted, i.e., is there a need for arbitration (Stage 540).

Figure 6:
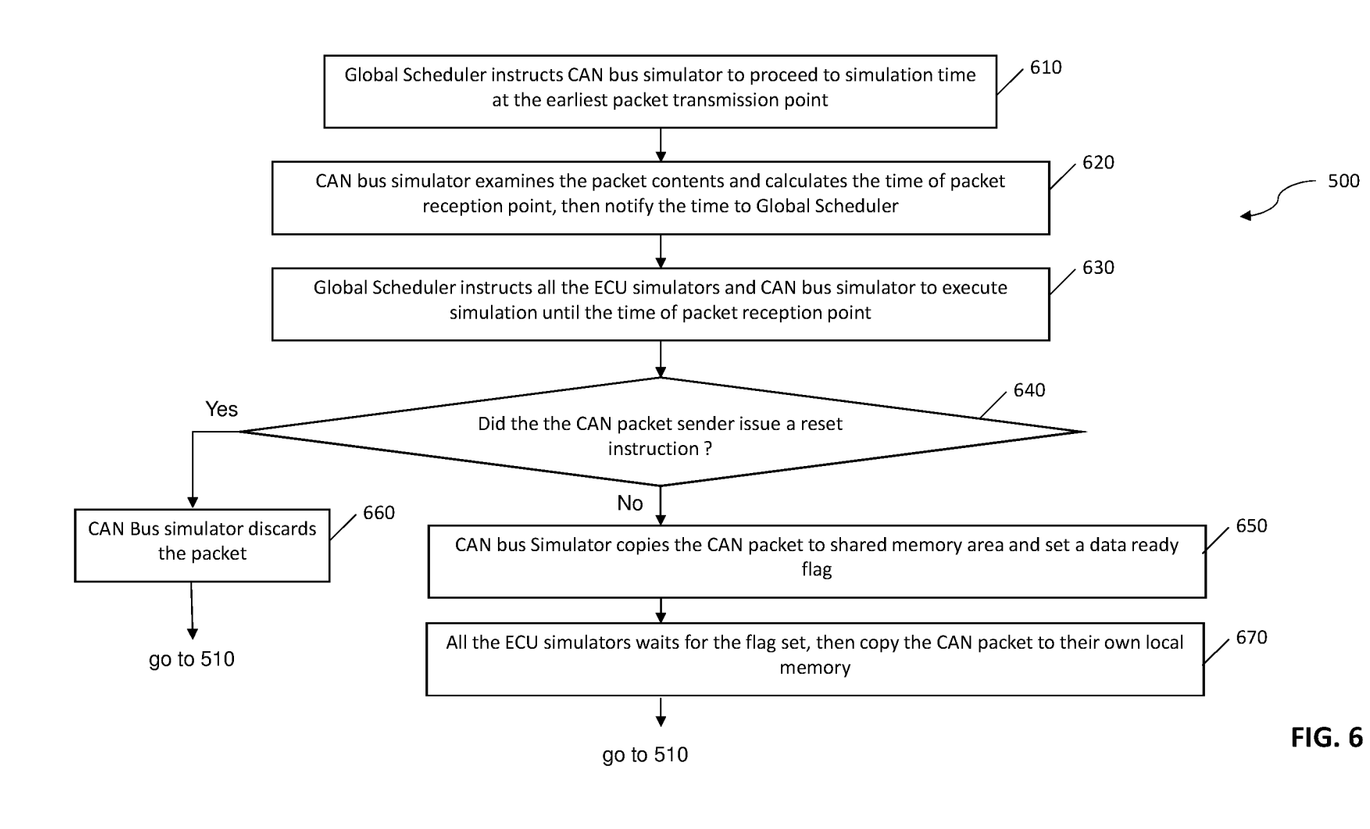

If there is no need for arbitration, turning to FIG. 6, the Global Scheduler 440 instructs the CAN BUS simulator 430 to proceed to a simulation time at the earliest packet transmission point (Stage 610). The CAN BUS simulator 430 examines the CAN packet contents, calculates the time of the CAN packet reception point, and notifies the time to the Global Scheduler 440 (Stage 620). The Global Scheduler 440 instructs all of the ECU simulators 410 and the CAN BUS simulator 430 to execute the simulation until the time of the packet reception point (Stage 630). A check is made to determine of the CAN packet sender issued a reset instruction (Stage 640), and if so the CAN BUS simulator 430 discards the packet (Stage 660) and flow returns to Stage 510. If the CAN packet sender did not issue a reset instruction (Stage 640), the CAN BUS simulator 430 copies the CAN packet to a shared memory area and sets a data ready flag (Stage 650). All of the ECU simulators 410 wait for the data read flag to be set, then copy the CAN packet to their own respective local memory (Stage 670). After this, the flow returns to Stage 510.

Figure 7:
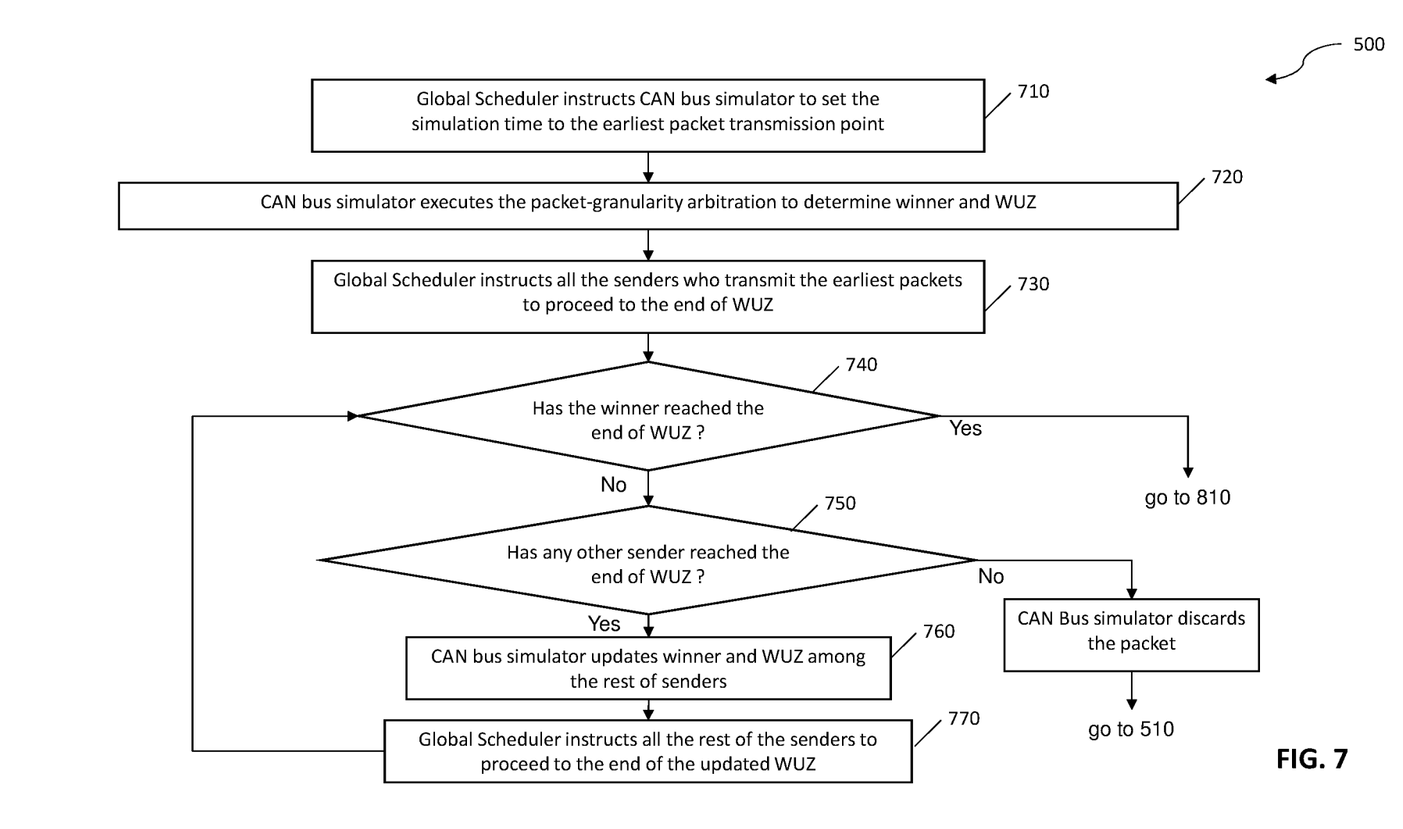

Returning to Stage 540, if there is a need for arbitration, turning to FIG. 7, The Global Scheduler 440 instructs the CAN BUS simulator 430 to set the simulation time to the earliest packet transmission point (Stage 710). The CAN BUS simulator 430 executes a packet-granularity arbitration to determine a winner and WUZ (Stage 720). The Global Scheduler 440 instructs all the senders who transmit the earliest packets to proceed to the end of WUZ (Stage 730). If the winner has not reached the end of WUZ (Stage 740), then a check is made to see if any other sender reached the end of WUZ (Stage 750), and if not the CAN BUS simulator 430 discards the packet and flow returns to Stage 510. If another sender has reached the end of WUZ, the CAN BUS simulator updates the winner and WUZ among the rest of the senders (Stage 760). The Global Scheduler 440 instructs all the rest of the senders to proceed to the end of the updated WUZ (Stage 770), and flow returns to Stage 740.

Figure 8:
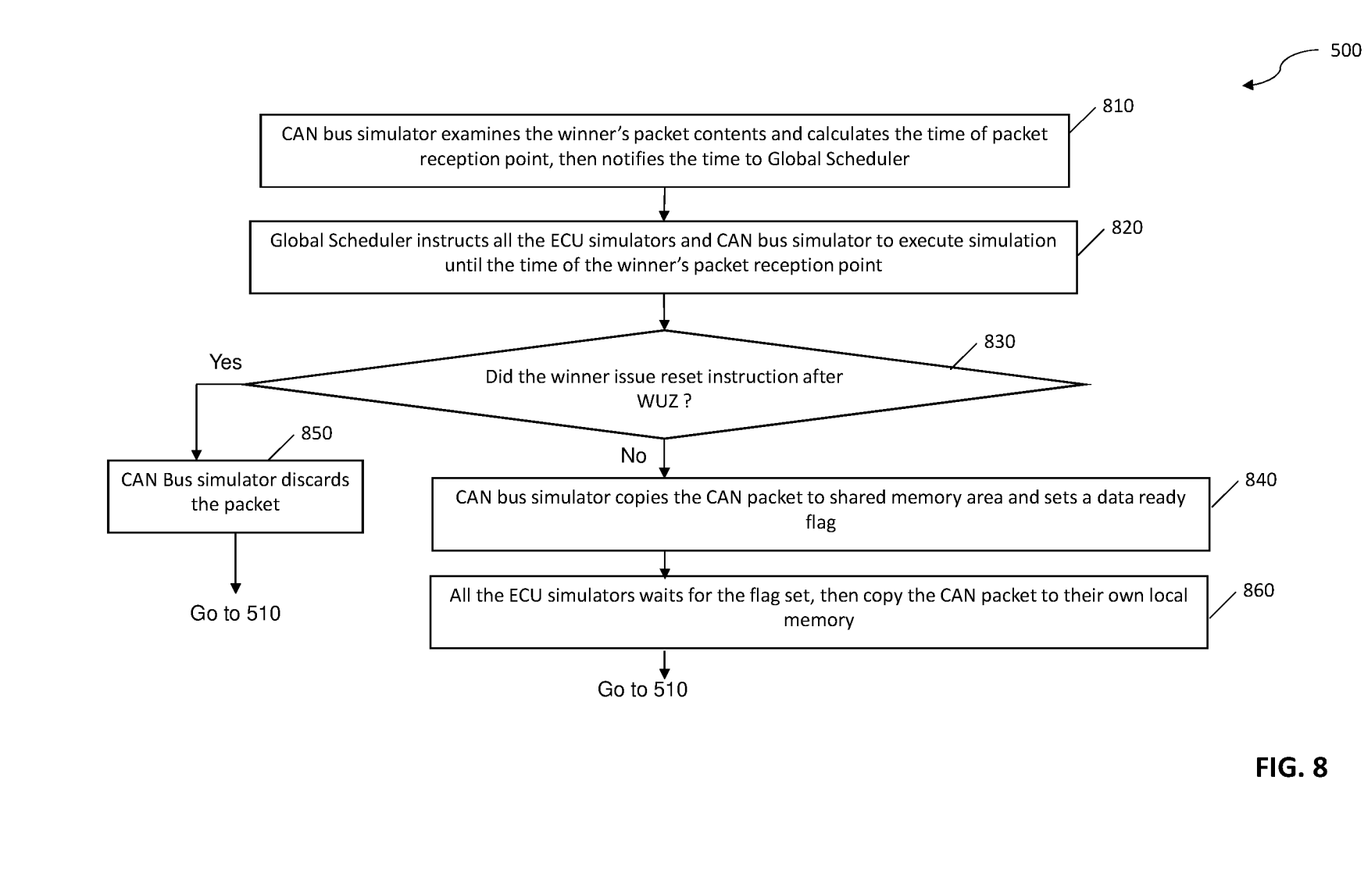

Returning to Stage 740, if the winner has reached the end of WUZ, then, turning to FIG. 8, the CAN BUS simulator 430 examines the winner's packet contents, calculates the time of the packet reception point, then notifies the time to the Global Scheduler 440 (Stage 810). The Global Scheduler instructs all the ECU simulators 410 and the CAN BUS simulator 430 to execute the simulation until the time of the winner's packet reception point (Stage 820). If the winner issued a reset instruction after WUZ (Stage 830), the CAN BUS simulator 430 discards the packet (Stage 850), and flow returns to Stage 510. If the winner did not issue a reset instruction after WUZ (Stage 830), the CAN BUS simulator 430 copies the CAN packet to the shared memory area and sets a data ready flag (Stage 840). All the ECU simulators 410 wait for the data ready flag set, then copy the CAN packet to their own respective local memory (Stage 860). After this, the flow returns to Stage 510.

Experimental data has demonstrated a ten to twelve-time increase in high-speed simulation in the disclosed invention, while maintaining the accuracy of the conventional bit-wise methodology. In a simulation lasting 100 seconds with an 80 MHz CPU simulated in an ECU, a data frame was repeatedly transmitted 10,000 times with a 10 msec. period. Execution times were compared between the disclosed packet-wise method of the invention and the conventional bit-wise method. The bit-wise method took 175.1 seconds to execute, whereas the packet-wise method for the invention executed in 13.8 seconds.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of simulating a plurality of electronic control units ("ECU"s) in communication over a simulated bus comprising:
    simulating, by a processor, an operation of a first ECU and an operation of a second ECU;
    performing arbitration, by the processor, at a packet-level granularity at a packet transmission start point with respect to a first packet sent to the simulated bus by the first ECU and a second packet sent to the simulated bus by the second ECU;
    identifying, by the processor, an initially winning ECU in the arbitration and a zone from the packet transmission start point to a bit where the initially winning ECU is determined to win based on the arbitration;

continuing, by the processor, the simulation of the operation of the first ECU and the operation of the second ECU to the end of the zone;

determining, by the processor, a final winning ECU between the first ECU and the second ECU at the end of the zone and placing a final non-winning ECU in a stop state, wherein the final winning ECU is determined to be the initially winning ECU unless the initially winning ECU generates a reset instruction during the zone;

enabling, by the processor, the final winning ECU to unlock the final non-winning ECU from the stop state and permitting the first ECU and the second ECU to proceed to a packet reception point; and permitting, by the processor, the final non-winning ECU to receive the packet transmitted by the final winning ECU.

2. The computer-implemented method of claim 1 further comprising repeating, by the processor, the steps of claim 1 while a simulation time period has not been met.

3. The computer-implemented method of claim 1, wherein simulating, by a processor, the operation of a first ECU and the operation of a second ECU further comprises simulating, by the processor, the operation of a first ECU and the operation of a second ECU until an end of a next base synchronization interval.

4. The computer-implemented method of claim 1 further comprising when the initially winning ECU generates the reset instruction the packet associated with the initially winning ECU is discarded and the method returns to simulating, by the processor, the operation of a first ECU and the operation of a second ECU.

5. The computer-implemented method of claim 1 further comprising storing the packet associated with the initially winning ECU to a shared memory area and setting a data ready flag.

6. The computer-implemented method of claim 5 further comprising an initially non-winning ECU copying, by the processor, the packet associated with the initially winning ECU from the shared memory area to a memory area associated with the non-winning ECU.

7. The computer-implemented method of claim 1 further comprising when an end of zone is reached and when the final winning ECU issues the reset instruction discarding the packet associated with the final winning ECU.

8. A system comprising:
a processor;
a memory communicatively coupled to the processor, the memory having stored therein instructions that when executed cause the processor to:
    simulate an operation of a first ECU and an operation of a second ECU;
    perform arbitration at a packet-level granularity at a packet transmission start point with respect to a first packet sent to a simulated bus by the first ECU and a second packet sent to the simulated bus by the second ECU;
    identify an initially winning ECU in the arbitration and a zone from the packet transmission start point to a bit where the initially winning ECU is determined to win based on the arbitration;
    continue the simulation of the operation of the first ECU and the operation of the second ECU to the end of the zone;
    determine a final winning ECU between the first ECU and the second ECU at the end of the zone and place a final non-winning ECU in a stop state, wherein the final winning ECU is determined to be the initially winning ECU unless the initially winning ECU generates a reset instruction during the zone;
    enable the final winning ECU to unlock the final non-winning ECU from the stop state and permit the first ECU and the second ECU to proceed to a packet reception point; and
    permit the final non-winning ECU to receive the packet transmitted by the final winning ECU.

9. The system of claim 8, wherein the instructions cause the processor to repeat the steps of claim 8 while a simulation time period has not been met.

10. The system of claim 8, wherein causing the processor to simulate the operation of a first ECU and the operation of a second ECU further comprises causing a processor to simulate the operation of a first ECU and the operation of a second ECU until an end of a next base synchronization interval.

11. The system of claim 8, wherein the instructions further cause the processor, when the initially winning ECU generates the reset instruction, discard the packet associated with the initially winning ECU and return to the instruction to simulate the operation of a first ECU and the operation of a second ECU.

12. The system of claim 8, wherein the instructions further cause the processor to store the packet associated with the final winning ECU to a shared memory area and set a data ready flag.

13. The system of claim 12, wherein the instructions further cause the processor to have a final non-winning ECU copy the packet associated with the final winning ECU from the shared memory area to a memory area associated with the non-winning ECU.

14. The system of claim 8, wherein when an end of zone is reached and when the final winning ECU issues the reset instruction the instructions cause the processor to discard the packet associated with the final winning ECU.

15. A computer program product for simulating a plurality of electronic control units ("ECU"s) in communication over a simulated bus, the computer program product comprising a computer readable storage medium having program instructions embodied therewith, the program instructions executable by a processor to cause the processor to:
    simulate an operation of a first ECU and an operation of a second ECU;
    perform arbitration at a packet-level granularity at a packet transmission start point with respect to a first packet sent to the simulated bus by the first ECU and a second packet sent to the simulated bus by the second ECU;
    identify an initially winning ECU in the arbitration and a zone from the packet transmission start point to a bit where the initially winning ECU is determined to win based on the arbitration;
    continue the simulation of the operation of the first ECU and the operation of the second ECU to the end of the zone;
    determine a final winning ECU between the first ECU and the second ECU at the end of the zone and place a final non-winning ECU in a stop state, wherein the final winning ECU is determined to be the initially winning ECU unless the initially winning ECU generates a reset instruction during the zone;
    enable the final winning ECU to unlock the final non-winning ECU from the stop state and permit the first ECU and the second ECU to proceed to a packet reception point; and permit the final non-winning ECU to receive the packet transmitted by the final winning ECU.

16. The computer program product of claim 15, wherein the instructions cause the processor to repeat the steps of claim 15 while a simulation time period has not been met.

17. The computer program product of claim 15, wherein causing the processor to simulate the operation of a first ECU and the operation of a second ECU further comprises causing a processor to simulate the operation of a first ECU and the operation of a second ECU until an end of a next base synchronization interval.

18. The computer program product of claim 15, wherein the instructions further cause the processor, when the initially winning ECU generates the reset instruction, discard the packet associated with the initially winning ECU and return to the instruction to simulate the operation of a first ECU and the operation of a second ECU.

19. The computer program product of claim 15, wherein the instructions further cause the processor to store the packet associated with the final winning ECU to a shared memory area and set a data ready flag.

20. The computer program product of claim 19, wherein the instructions further cause the processor to have an final non-winning ECU copy the packet associated with the final winning ECU from the shared memory area to a memory area associated with the non-winning ECU.

* * * * *